(12) United States Patent
Holland

(10) Patent No.: US 8,304,875 B2
(45) Date of Patent: Nov. 6, 2012

(54) SEMICONDUCTOR PACKAGES

(75) Inventor: Andrew G. Holland, Swaffham Bulbeck (GB)

(73) Assignee: RF Module and Optical Design Limited, Cambridge (GB)

( * ) Notice: Subject to any disclaimer, the term of this patent is extended or adjusted under 35 U.S.C. 154(b) by 0 days.

(21) Appl. No.: 12/452,163

(22) PCT Filed: Jun. 13, 2008

(86) PCT No.: PCT/GB2008/002028
§ 371 (c)(1),
(2), (4) Date: Dec. 16, 2009

(87) PCT Pub. No.: WO2008/155522
PCT Pub. Date: Dec. 24, 2008

(65) Prior Publication Data
US 2010/0127372 A1 May 27, 2010

(30) Foreign Application Priority Data
Jun. 16, 2007 (GB) .................................. 0711676.7

(51) Int. Cl.
*H01L 23/02* (2006.01)
(52) U.S. Cl. ....................... 257/686; 257/777
(58) Field of Classification Search .................. 257/777, 257/686, 723, 724
See application file for complete search history.

(56) References Cited

U.S. PATENT DOCUMENTS

| 6,558,978 | B1 * | 5/2003 | McCormick | 438/108 |
|---|---|---|---|---|
| 6,710,454 | B1 | 3/2004 | Boon | |
| 6,765,299 | B2 * | 7/2004 | Takahashi et al. | 257/777 |
| 8,048,715 | B2 * | 11/2011 | Corisis et al. | 438/107 |
| 2001/0005600 | A1 | 6/2001 | Ohuchi | |
| 2005/0082657 | A1 | 4/2005 | Tago | |

FOREIGN PATENT DOCUMENTS

JP 2004/0128523 A 4/2004

* cited by examiner

*Primary Examiner* — S. V Clark
(74) *Attorney, Agent, or Firm* — Dilworth Paxson, LLP

(57) ABSTRACT

A semiconductor package comprising a first semiconductor sub-package (40) having a connection face (44) with un-supported connectors (21) depending therefrom arranged to electrically connect a first semiconductor device contained therein to an external circuit, and at least one second semiconductor sub-package (42) also having a connection face (46) with un-supported connectors (25) depending therefrom arranged to electrically connect a second semiconductor device contained therein to an external circuit, the second semiconductor sub-package (42) also having an attachment face (48), on an opposite side thereof from the connection face (46); wherein the second semiconductor sub-package (42) is mounted on the first semiconductor sub-package (40) such that its attachment face (48) is coupled to the connection face (44) of the first semiconductor sub-package (40).

20 Claims, 17 Drawing Sheets

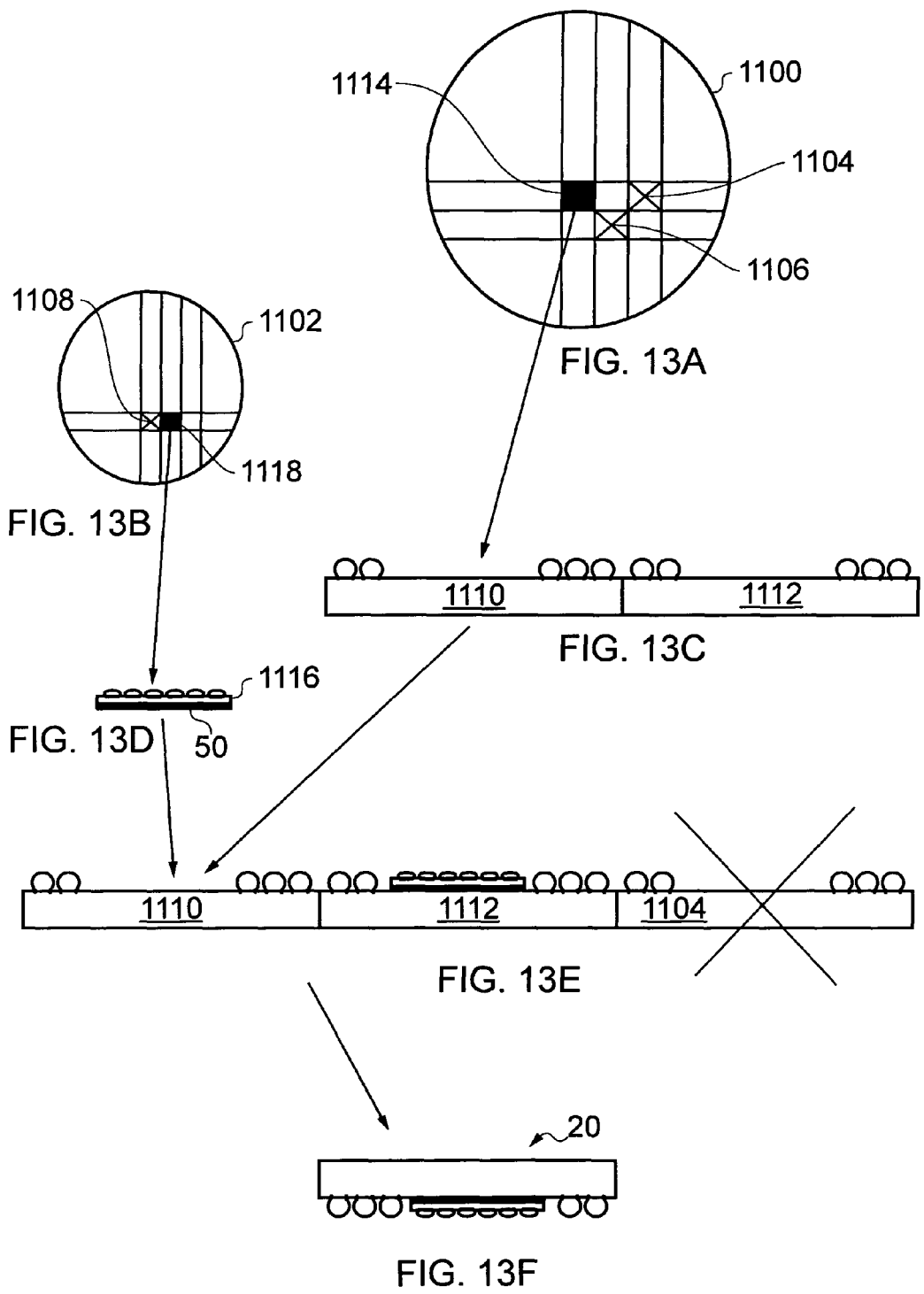

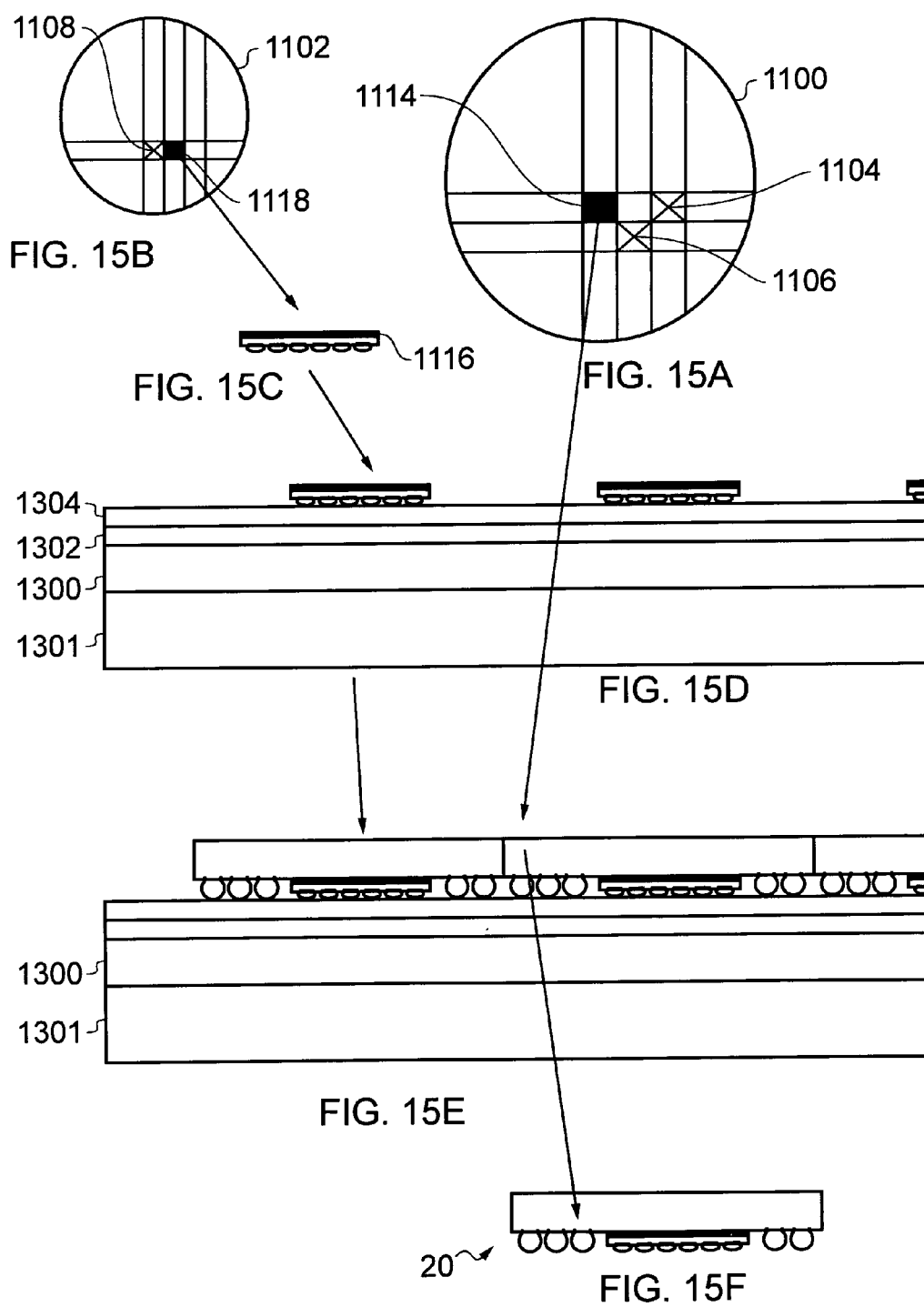

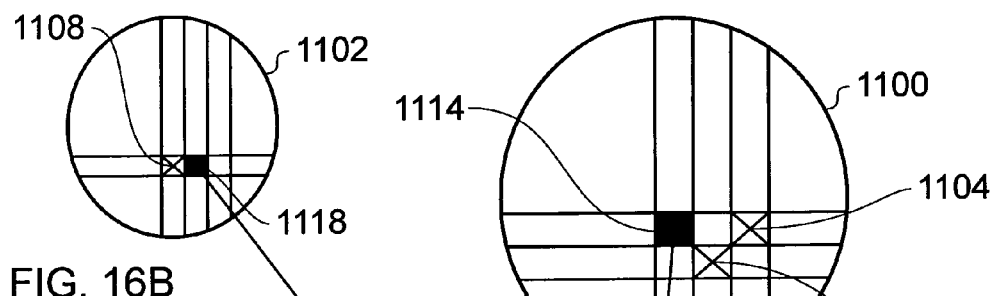
FIG. 16B
FIG. 16A
FIG. 16C
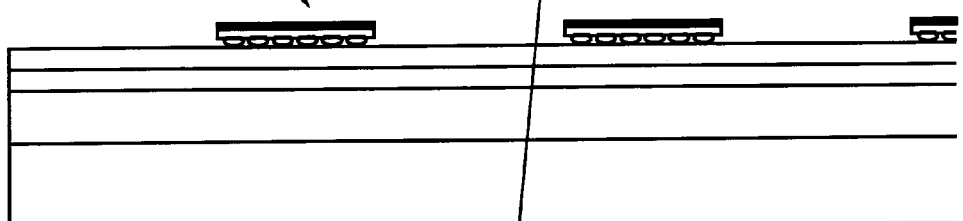
FIG. 16D
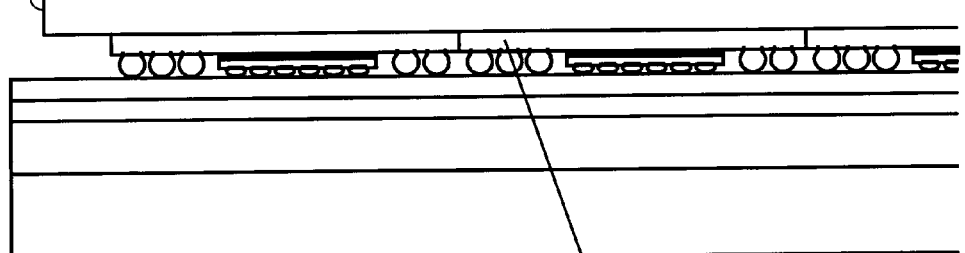
FIG. 16E
FIG. 16F

SEMICONDUCTOR PACKAGES

The present invention relates to semiconductor packages, mounting assemblies therefor and a method of manufacture, and more particularly but not limited to, micro mounting packages which are commonly called Wafer-Level Chip-Scale Packages (WLCSP).

The object of any electronics package is to protect the sensitive semiconductor devices from harsh environments without inhibiting electrical performance. The package needs to reliably attach a semiconductor device to an intended device or system board establishing both a mechanical and electrical connection. In many commercial markets the package needs to be cost-effective whilst minimising total plan area covered by the package.

One popular family of electronics package is the Wafer-Level-Chip-Scale-Package or WLCSP. WLCSP is popular in space limited, cost critical portable electronics markets such as mobile phones.

One reason for the WLCSP package's popularity is the fact that the packaged semiconductor device is the same size as the original semiconductor device i.e. "Chip-Scale". Alternative package types often incur an area and/or height overhead.

WLCSP manufacturing and electrical functional test costs can be optimised through economies of scale as fabrication is usually completed whilst the semiconductor devices are still in their pre-diced wafer form, i.e. "Wafer-Level."

An example of a WLCSP 10 is shown in FIGS. 1 to 3 below. WLCSP's consists of a single semiconductor chip 23 with additional post-processed packaging layers 24 being deposited, usually on the semiconductor device active surface, whilst the semiconductor device and its neighbouring devices are in the manufacturing wafer form. The multiple additional packaging layers are commonly of sequentially deposited, thin-film dielectric and electrically conducting metal layers.

In the final package 10, the outer layers are arranged to provide a protective barrier to elements (e.g. moisture and dust) which would damage the sensitive circuitry of the semiconductor device.

The packaging layers 24 provide redistribution of electrical signals connecting the semiconductor device's peripheral pads 600 ($1^{st}$ level) to a redistributed array of pads 22 often at an increased terminal pitch. Mounting packaged devices with an increased terminal pitch generally simplifies the mounting methods for connection to the system printed circuit board ($2^{nd}$ level). Semiconductor devices commonly have peripheral pads to accommodate wired connection in other types of electronics package.

The packaging layers 24 provide WLCSP termination pads 22 commonly having a surface finish (e.g. metallic) suitable for the mounting of final electrical connectors or terminations 25.

The redistributed array of pads is often, but not exclusively, set as an array of regular minimum pitch across the surface of the chip on the top of the WLCSP dielectric and conducting layers.

The pads 22 with connectors 25 within an array may be provided at different pitches. A first example, of a pitch of pads 22 is shown in FIG. 2 and a second example showing a smaller pitch, when compared to FIG. 2, is shown in FIG. 3.

Electrical signal redistribution from die peripheral connections through to an increased package terminal pitch has been shown to improve the reliability of the mounting to the printed circuit board. Those skilled in the art will accept that using an underfill material dispensed in the spaces between system board and underside of the WLCSP will further increase reliability of the final mounted package. Those skilled in the art will also recognise that underfill material can generally be employed to further improve mechanical reliability of the mounting. Underfill material assists to evenly distribute the mechanical stresses induced to the WLCSP package during operational use in a product in which the package is mounted.

There are many common means of fabricating the required electrical connectors including electroless or electroplating, screen-printing, stencil placing pre-formed spheres of solder alloy, metal studs, metal pillars or columns, nano-fibres or plated structures formed from a base composite substrate e.g. of Copper/Nickel/Copper on Dielectric.

The total thickness of a WLCSP package is the sum of silicon thickness, redistribution layers and height of the finished electrical connector. It is therefore possible to design a WLCSP to have a predetermined total component height depending on design, method of manufacture and selection of materials.

U.S. Pat. No. 6,710,454 shows a semiconductor package which is formed by mounting, upon a first sub-package, a second sub-package and subsequently forming connectors to both of the sub-packages through a supportive resin material. During the fabrication steps of the connectors there is potential to damage either or both of the sub-packages thereby rending the whole of the semiconductor package useless.

JP2004-128523 shows a semiconductor package which is again formed by mounting, upon a first sub-package, a second sub-package and subsequently forming connectors by back grinding a supportive resin. Again, the process steps used after the sub-packages have been combined can lead to damage of either or both of the sub-packages thereby rendering the whole of the semiconductor package useless.

SUMMARY OF THE INVENTION

According to a first aspect of the invention there is provided a semiconductor package comprising:

a first semiconductor sub-package having a connection face with connectors depending therefrom arranged to electrically connect a first semiconductor device contained therein to an external circuit, and at least one second semiconductor sub-package also having a connection face with connectors depending therefrom arranged to electrically connect a second semiconductor device contained therein to an external circuit, the second semiconductor sub-package also having an attachment face, on an opposite side thereof from the connection face;

wherein the second semiconductor sub-package is mounted on the first semiconductor sub-package such that its attachment face is adjacent the connection face of the first semiconductor sub-package.

Such an embodiment is advantageous as it helps to increase the density with which semiconductor devices can be packaged onto a circuit board.

Generally, the attachment face of the second semiconductor sub-package is mounted upon the connection face of the first semiconductor sub-package. However, the skilled person will appreciate that layers of material may be placed between the two and such an arrangement is envisaged to fall within the phrase 'coupled to'.

Generally the second semiconductor sub-package is arranged such that a bottom face of the connectors of the first semiconductor sub-package is arranged to be substantially in a plane with a bottom face of the connectors of the second semiconductor sub-package. Such an arrangement is perhaps advantageous as it allows the package to be applied to a generally planar circuit board such that no modification of the circuit board is needed.

At least one of the first semiconductor sub-package and the second semiconductor sub-package is a Wafer Level Chip-Scale Package (WLCSP).

The connectors of the first and/or second semiconductor sub-package may comprise any suitable means. In particular the connectors may comprise any of: spheres or "balls" of pre-formed metal alloy commonly of solder, or smaller, plated or printed metal "bumps", columns or pillars. The connectors may be formed from a material other than solder such as gold, nickel, conductive adhesive, or the like. Examples of suitable connectors may be seen at www.flipchips.com/photos.html Generally, the connectors of the first and/or second sub-packages are unsupported; i.e. they rely upon their own mechanical strength to maintain their position. Thus, the connectors depend from the connection face unsupported.

As will be appreciated by the skilled person a ball connector (i.e. a "ball") type may typically have a height of roughly 0.100 mm to 0.800 mm. Bump (i.e. a "bump") or column/pillar connector types may have a typical height of roughly 0.025 mm to 0.200 mm In one embodiment the connectors of the first semiconductor sub-package are balls (may be of solder) and the connectors of the second semiconductor sub-package are bumps (may be of solder). Such an arrangement is advantageous as the solder balls tend to have a greater height and as such it may be easier to fabricate the package. The skilled person will appreciate that the provision of solder based connectors should allow the package to be mounted upon the surface of a circuit board.

The use of solder based connectors for both the first and second semiconductor packages is advantageous as, when flowable, it will help to compensate for tolerances such as small differences in height (planarity) of connection face in both the package and circuit board and/or module substrate.

In another embodiment, the connectors of the first and/or second semiconductor sub-packages are metal bumps. The skilled person will appreciate that such an arrangement is convenient for the embedding of the package within a laminated layer structure of a system circuit board and/or module substrate.

In some embodiments the connectors of the first and second semiconductor sub-packages are of different dimensions. Generally, the connectors of the second semiconductor sub-package are smaller than the connectors of the first semiconductor sub-package. Having smaller connectors on the second semiconductor sub-package is advantageous as it can increase the number of connectors that can be provided on the second semi-conductor sub-package.

The pitch size of the connectors on the second semiconductor sub-package may be larger, equal or more commonly smaller than the pitch size of the connectors on the first semiconductor sub-package. Again, having a smaller pitch size is convenient as it helps to increase the number of connectors that can be provided on the second semiconductor sub-package.

In one embodiment the height of the second semiconductor sub-package and the connectors depending therefrom is arranged to be substantially equal to the height of the connectors depending from the first semiconductor sub-package. Such an arrangement is convenient as it again helps to simplify fabrication of the package.

In some embodiments there may be a plurality of second semiconductor sub-packages mounted such that their attachment face is adjacent to (or indeed coupled to) the connection face of the first semiconductor sub-package. Such an arrangement can increase the efficiency with which space may be used on a circuit board on which the package is mounted. The greater the number of second sub-packages that are included in the package the greater the utilisation of the area of the circuit board.

Those skilled in the art will accept that there may be a general benefit in being able to mount second semiconductor sub-packages of a different base technology to that of the first semiconductor sub-package. For example the second sub-package may contain a second semiconductor device made from a material such as Gallium Arsenide may be fitted to a first sub-package containing a first semiconductor device of type silicon CMOS, so as to offer improved switching of RF signals. As a further example, a specialised silicon memory device may be mounted to support the function of the first semiconductor and/or system. Other combinations of materials (i.e. base technologies) are equally possible.

Generally, the second semiconductor sub-package will be attached to the first semiconductor sub-package with an attachment means. Such attachment means is conveniently an adhesive such as epoxy adhesive, solder alloy, anisotropic conductive adhesive or plated nano-fibres. Epoxy adhesive may be syringe deposited in the form of an epoxy paste or deposited as an epoxy film at the wafer level.

The attachment means is generally arranged to be resistant to adverse environmental conditions (e.g. moisture ingression, physical deformation, temperature expansion). That is the attachment means may be chosen to be impermeable or substantially impermeable to moisture and/or may be chosen to have a compatible coefficient of thermal expansion to that of the system printed circuit board, module substrate or first and second semiconductor sub-packages. Such a selection of the attachment means is advantageous as it helps to protect the circuitry within the first and/or second semiconductor sub-package. The term compatible is intended to mean that the thermal expansion of the attachment means is chosen such that differential expansion between the attachment means and other materials does not cause problems. Compatible may for example mean that the coefficient of thermal expansions are substantially equal.

The attachment means may be electrically conductive. However, in other embodiments, the attachments means may be electrically non-conductive. Use of different attachment materials may improve performance in thermal conduction, electrical isolation of unwanted signal between semiconductor devices, electromagnetic shielding, electrical ground reference, production yield, reliability and cost.

The connectors of the first semiconductor sub-package will generally be provided as a grid. However, irrespective of whether or not the connectors of the first semiconductor sub-package are provided as a grid an area of the connection face may be provided with substantially no connectors. Such an arrangement is advantageous as it provides an area to which the second semiconductor sub-package may be attached.

In some embodiments of the invention the connectors of the first and/or second semiconductor sub-packages are encapsulated in a protective material. The protective material may be any suitable material such as for example thermoset plastics materials and/or thermoplastic plastics materials including epoxy, phenolic and/or silicone resins. Such a protective material is advantageous as it can increase the mechanical robustness of the package.

Should a protective material be used the connectors of the first and/or second semiconductor device will generally protrude (or at least be accessible) through a surface (generally the bottom surface) of the protective material. Such an arrangement makes it easier to connect the package to a circuit board.

The skilled person will appreciate suitable techniques to remove the protective material which would typically be via chemical or mechanical means (use of grinding) to expose the connectors of a single wafer-level-chip-scale-package device.

A further sub-package (which may also contain a further semiconductor device) may be provided on a face of the first sub-package opposite the connection face.

The first sub-package may have vias provided therethrough. Such vias may be provided using Through Silicon Via (TSV) technology. Such vias may be arranged to connect the connection face of the first sub-package to the side of the first sub-package opposite the connection face. An advantage of using such vias (whether fabricated from TSV or not) is that the length of electrical interconnections may be reduced; they can pass through the first sub-package rather than around it.

End regions of the vias on the side opposite the connection face may be exposed such that pads arranged to have connections made thereto may be connected thereto.

The pads on the vias may be provided from copper or any other suitable material.

Solder bumps, balls or any other connectors may be provided on the pads.

The further sub-package may be electrically connected to the vias. The vias may or may not connect to the first semiconductor device within the first sub-package.

The second semiconductor device within the second sub-package may be electrically connected to the vias. As such the second semiconductor device may be electrically connected to the first semiconductor device and/or connected to the further semiconductor device.

In some embodiments an electrically conductive material may be provided between any of the sub-packages which may be used to electrically connect semiconductor devices within the sub-packages. The electrically conductive material may be provided by any suitable means which includes Anisotropic Conductive Adhesive (ACA) or Anisotropic Conductive Film (ACF).

In other embodiments, the first and second sub-packages are arranged such that connections between the first and second sub-packages are made by connecting connectors of the first and second sub-packages via a board, substrate or the like to which the package is connected. Such an arrangement may be convenient because it may help to reduce the complexity of the sub-packages. However, arrangements in which vias, wire bonds or the like are used to interconnect sub-packages within the package may allow for a higher number of external connections from the package since none, or at least fewer, of the external connections would be used for interconnecting sub-packages.

The further sub-package may be electrically connected to using wire bonds.

The package may comprise a substrate on which any of the first, second or further sub-packages are mounted. Any of the first, second and/or further sub-packages may be electrically connected to the substrate. Electrical connection to the substrate may be by way of connectors of the sub-package, use of vias and/or using wire bonds.

Any of the semiconductor devices within the first, second and further sub-packages may be electrically connected to one another. Such electrical connection may be by way of vias, which may be through any of the sub-packages, wire bonds, or the like.

According to a second aspect of the invention there is provided a method of manufacturing a semiconductor package comprising:

fabricating at least one first semiconductor device on a wafer and incorporating it into a first semiconductor sub-package wherein each first semiconductor device has at least one connector on a connection face of the first semiconductor sub-package;

fabricating at least one second semiconductor device on a wafer and incorporating it into a second semiconductor sub-package wherein each second semiconductor device has at least one connector on a connection face of the second semiconductor sub-package and the second semiconductor sub-package also has an attachment face, on an opposite side thereof from the connection face;

the method further comprising dividing the first and second semiconductor sub-packages from the wafer and attaching one or more of the second semiconductor sub-packages to each of the first semiconductor sub-packages such that the attachment face of the second semiconductor sub-package is adjacent to the connection face of the first semiconductor sub-package.

As such, embodiments of the method may be advantageous as they provide a semiconductor package which provides greater utilisation of the surface area of a circuit board onto which the package is mounted. Further, it is thought to be advantageous that there are no significant processing steps once the second sub-package has been attached to the first sub-package since these could damage one or both of the sub-packages thereby rendering useless the whole package. Significant processing steps includes the deposition of material such as connectors and/or the removal of material such as back grinding, etc. Further, the method minimises the number of electrical, mechanical and chemical processing steps at each step, which is advantageous as each step carries the risk of introducing defects and reducing yield.

Generally, the first semiconductor device is fabricated from a first wafer and the second semiconductor device is fabricated from a second wafer. Such an arrangement is convenient as it allows the wafers to be produced using the same masks and designs for each semiconductor device fabricated thereon. However, it is conceivable that each of the first and second semiconductor devices are manufactured on the same wafer.

Generally, the method arranges the second semiconductor sub-package to have substantially the same thickness as the connectors of the first semiconductor sub-package. As such, the method may comprise thinning the second wafer or second semiconductor sub-packages although it may be more convenient to thin the second wafer as opposed to thinning the second semiconductor sub-packages.

The method may comprise using an attachment means to attach the second semiconductor sub-package to the first semiconductor sub-package. The attachment means may be an adhesive.

The method may arrange the attachment means such that it has a substantially uniform thickness. Uniform thickness may be achieved through accurate methods of deposition such as pre-formed film, syringe, spinning, screen and/or stencil-printing or use of a rakel.

The attachment means may be deposited before the first semiconductor sub-package is separated from the wafer on which it was fabricated since this is likely to be more convenient (i.e. whilst the first semiconductor device is still in wafer form). However, this need not be the case and it is conceivable that the attachment means may be deposited after the first semiconductor sub-package has been separated from the wafer; i.e. when the first semiconductor device is in die form.

Alternatively, or additionally, the attachment means may be deposited on the second semiconductor sub-package before the second semiconductor sub-package is attached to the first semiconductor device.

Generally, the attachment means may be deposited on the second semiconductor sub-package when the device is in die form; i.e. once it has been cut from the wafer on which it was fabricated. Alternatively, the attachment means may be deposited on the second semiconductor sub-package when it is still part of the wafer.

Conveniently, the second semiconductor sub-package is attached to the first semiconductor sub-package whilst the first semiconductor sub-package is part of the wafer; i.e. whilst it is in pre-diced wafer form. Such an arrangement is convenient because it facilitates ease of handling.

However, it is also conceivable that the second semiconductor sub-package is attached to the first semiconductor sub-package once the first semiconductor sub-package has been separated from the wafer; i.e. once the first semiconductor device is in die form.

The first and/or second semiconductor devices may be tested to ascertain whether they are functioning or at least that they are likely to function and to generate test data before they are separated from the wafer. The testing may be electrical testing and/or visual testing. Such testing is advantageous, as the skilled person will fully appreciate in order to make the subsequent processes of dicing and packaging more efficient; it helps to stop the packaging of non-functioning devices. It is conceivable that the first and/or second semiconductor devices could be tested after they have been separated from the wafer.

The test data may be used to create a so-called test-map which provides a map of the wafer indicating which first and/or second semiconductor devices are functioning and/or which first and/or second semiconductor devices do not function. Generation of a test map of functioning first and second semiconductor devices can be advantageous as it helps to ensure that known functioning second semiconductor devices can be attached to known functioning first semiconductor sub-packages which should help to ensure the yield of the process is higher.

In one embodiment the method comprises separating the second semiconductor sub-packages from the wafer. In this embodiment, whilst the first semiconductor devices are attached to the wafer a so-called pick and place machine is used to attach one or more second semiconductor sub-packages to a first semiconductor sub-packages. Conveniently, the test data is used to ascertain which first and second semiconductor sub-packages are selected.

In an alternative embodiment, the second semiconductor sub-packages may be placed on an interim tool, comprising a recessed plate, in a predetermined arrangement. Conveniently, the recessed plate is fabricated from, for example, silicon wafer, borosilcate glass, plastic, copper, brass or steel, or the like.

The arrangement of the second semiconductor sub-packages on the interim tool may be determined by use of the test map to determine which second semiconductor devices are selected for placement in the interim tool.

Subsequently, the wafer containing the first semiconductor devices may be applied to the interim tool such that the second semiconductor sub-packages are attached to the first semiconductor sub-packages.

Subsequently, the wafer of first semiconductor devices may be divided.

Conveniently, the interim tool is arranged to receive the wafer containing the first semiconductor devices. For example, the interim tool may have at least one recess. Such an arrangement is convenient as it can help to prevent the connectors of the first semiconductor devices from becoming damaged. Such recesses may be formed by methods such as chemically etching, milling, stamping or the like.

Further, the interim tool is provided with an alignment means arranged such that the wafer containing the first semiconductor devices can be aligned in a known manner. Such an alignment means is convenient as it can help to ensure that the correct second semiconductor sub-packages are attached to the correct first semiconductor sub-packages and/or in the correct orientation.

The alignment means may comprise cross-hair targets or defined polygonal features on opposing wafer and tool so as to allow manual or automated alignment by use of an imaging system.

In a further embodiment, a flat substrate may be provided, such as for example a glass or silicon wafer. A wafer image may be provided on the substrate, such as by a sheet of paper, plastic film, glass mask or the like, indicating the placement sites for the second semiconductor devices.

A sheet of transparent material, conveniently having a high coefficient of friction, may be provided above the wafer image. Such a transparent material may be useful in helping to prevent the second semiconductor devices moving from their desired position whilst alignment and placement is completed.

The transparent material being made of suitable materials such as clear silicone, rubber or Polyvinyl Chloride film.

Conveniently, the wafer containing the first semiconductor sub-packages is brought into contact with the second semiconductor sub-packages.

In any of the above embodiments, it is convenient to support the first and/or second wafers containing the first and/or second semiconductor devices during the processing. Such an arrangement is convenient as the wafers are likely to be of the order of 100 µm to 200 µm in thickness such that could well be damaged if they are unsupported.

Supporting the wafer prevents warpage and stresses. The wafer support eases handling of the thin wafer in assembly.

Support may be achieved through use of a dicing film to retain the first and/or second wafers on a metal frame.

The method may comprise creating vias through the first semiconductor sub-package. The vias may be fabricated by a plurality of processing techniques including High-rate silicon etching or Deep-Reactive-Ion-Etching ("DRIE").

The method may include mounting a further sub-package to a side of the first semiconductor sub-package opposite the connection face.

An embodiment of the invention is illustrated, by way of example only, with reference to the following drawings of which:

Figure 5A:
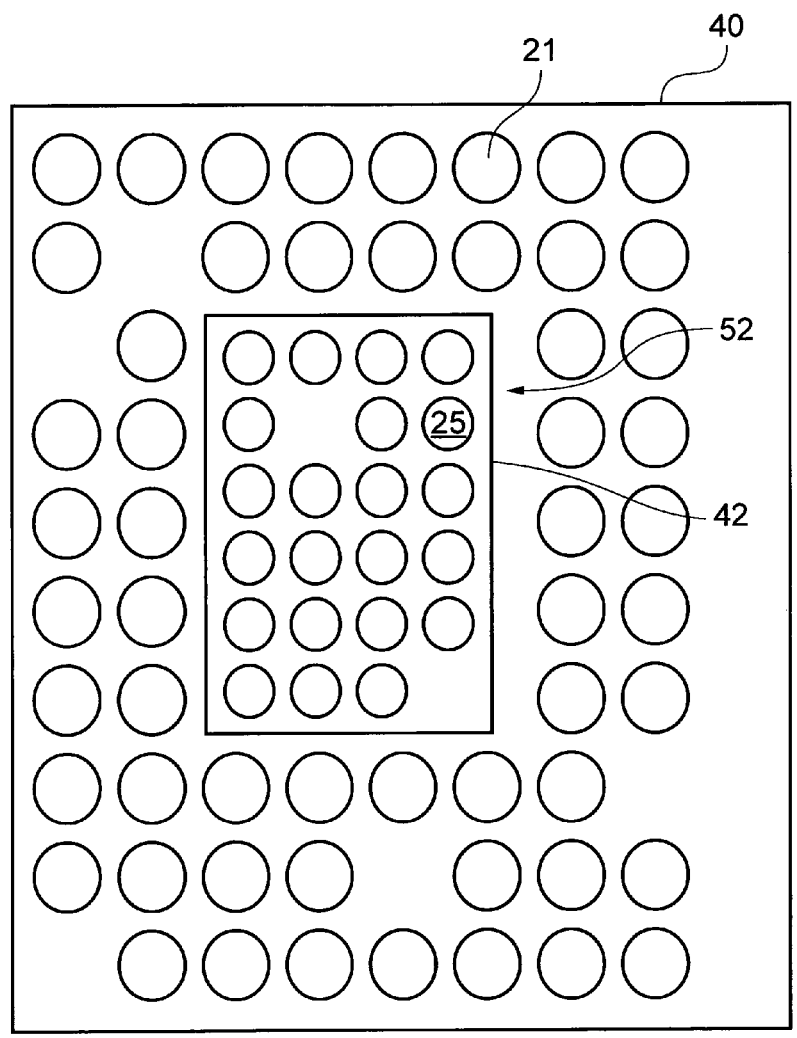
Figure 6:
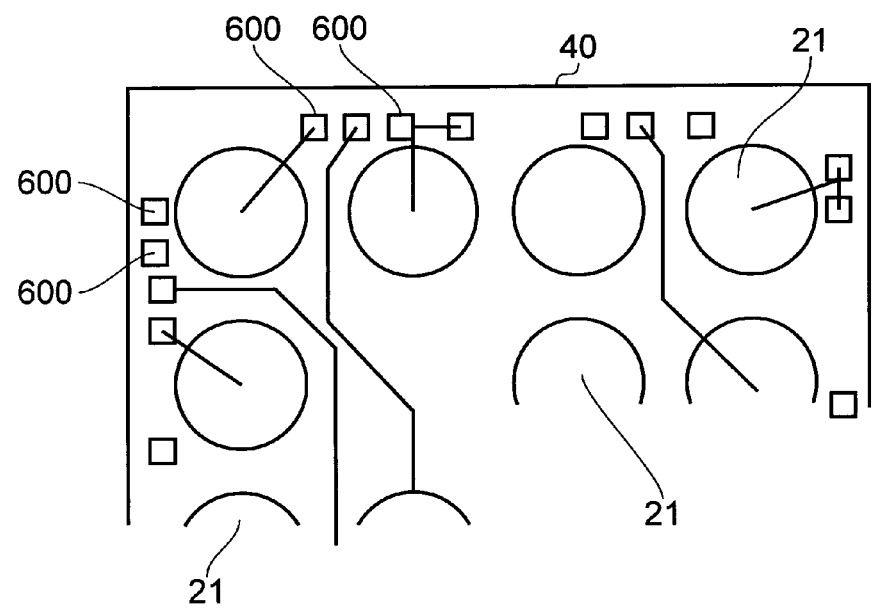
Figure 7:
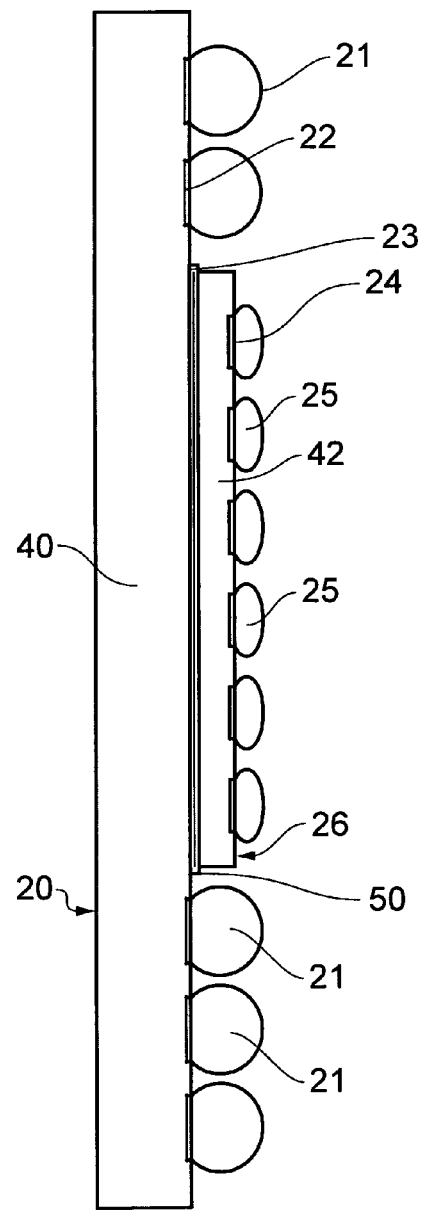

FIGS. 5a and b show a bottom plan views of a WLCSP-type semiconductor packages;

FIG. 6 (PRIOR ART) shows a bottom plan view of a WLCSP-type semiconductor package connection from peripheral wirebond pad to package connector according to the prior art;

FIG. 7 shows a side elevation, cross-sectional view of a semiconductor package according to a second embodiment of the invention.

Figure 8:
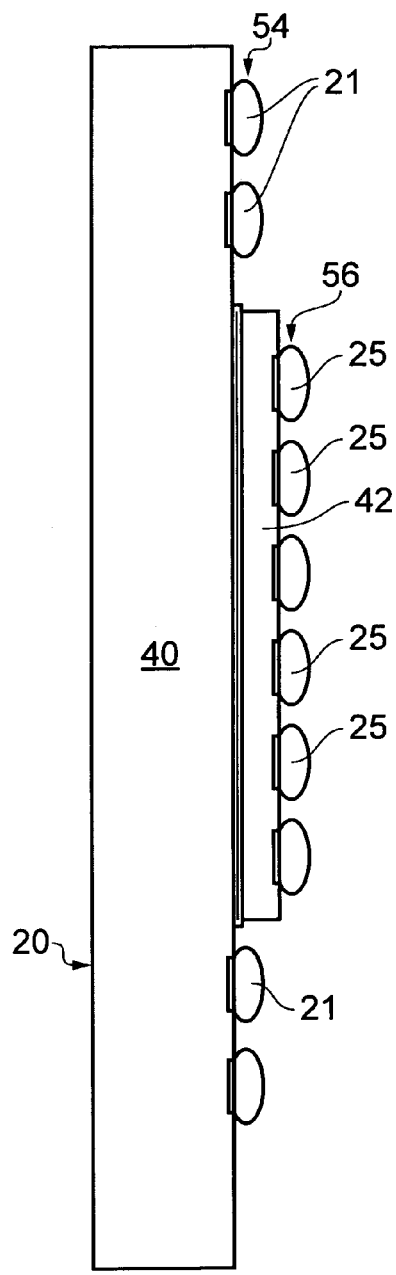
Figure 9:
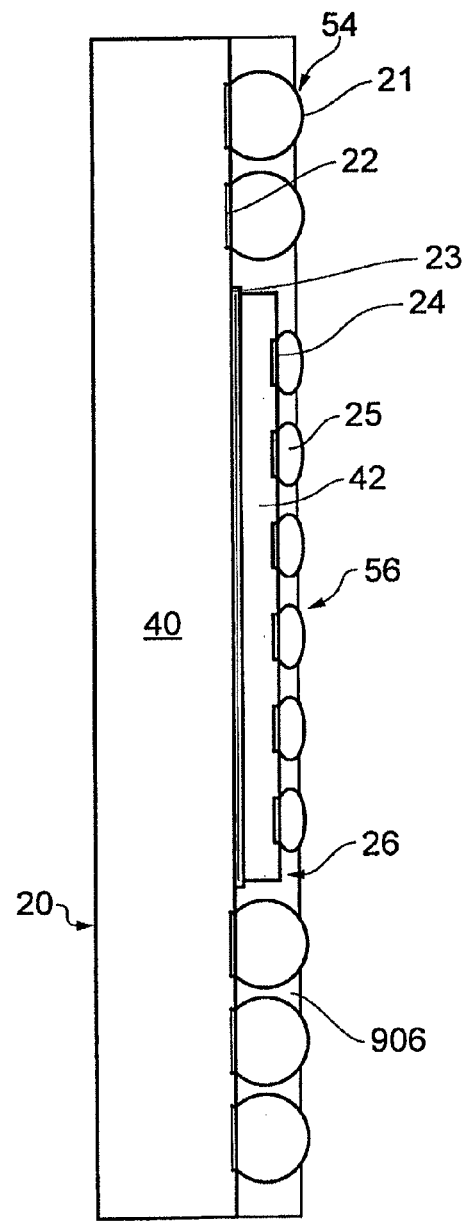
Figure 10:
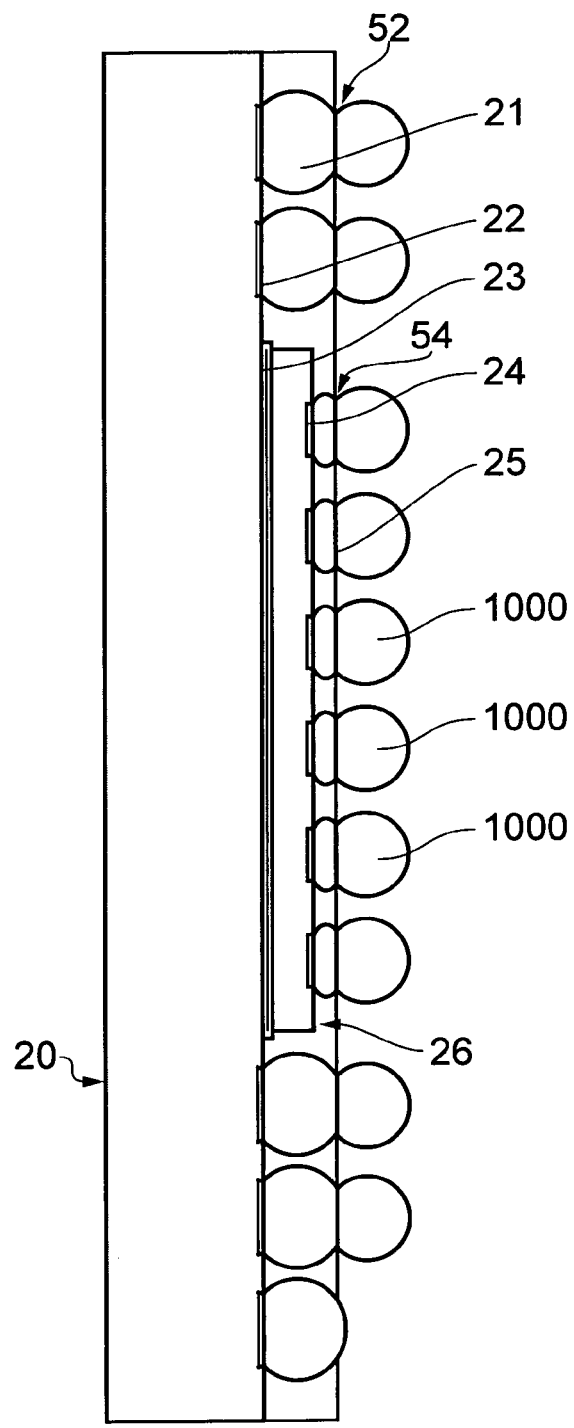
Figure 11:
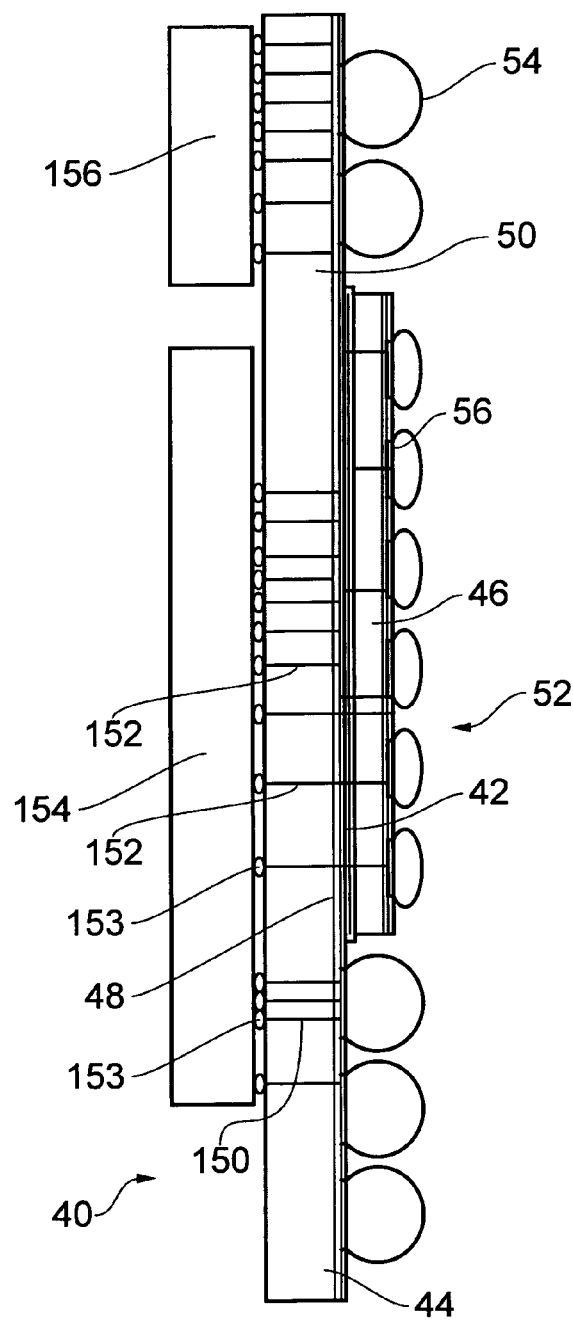
Figure 12:
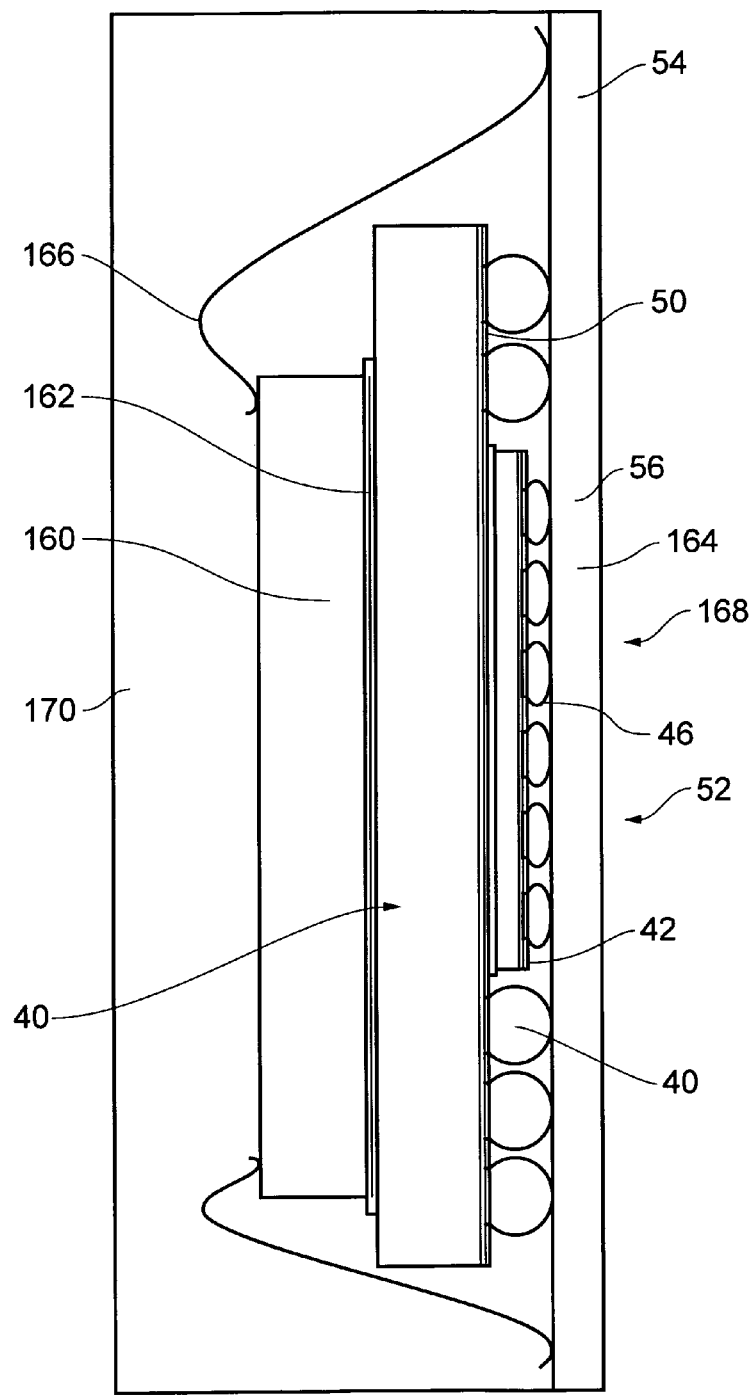
Figure 17:
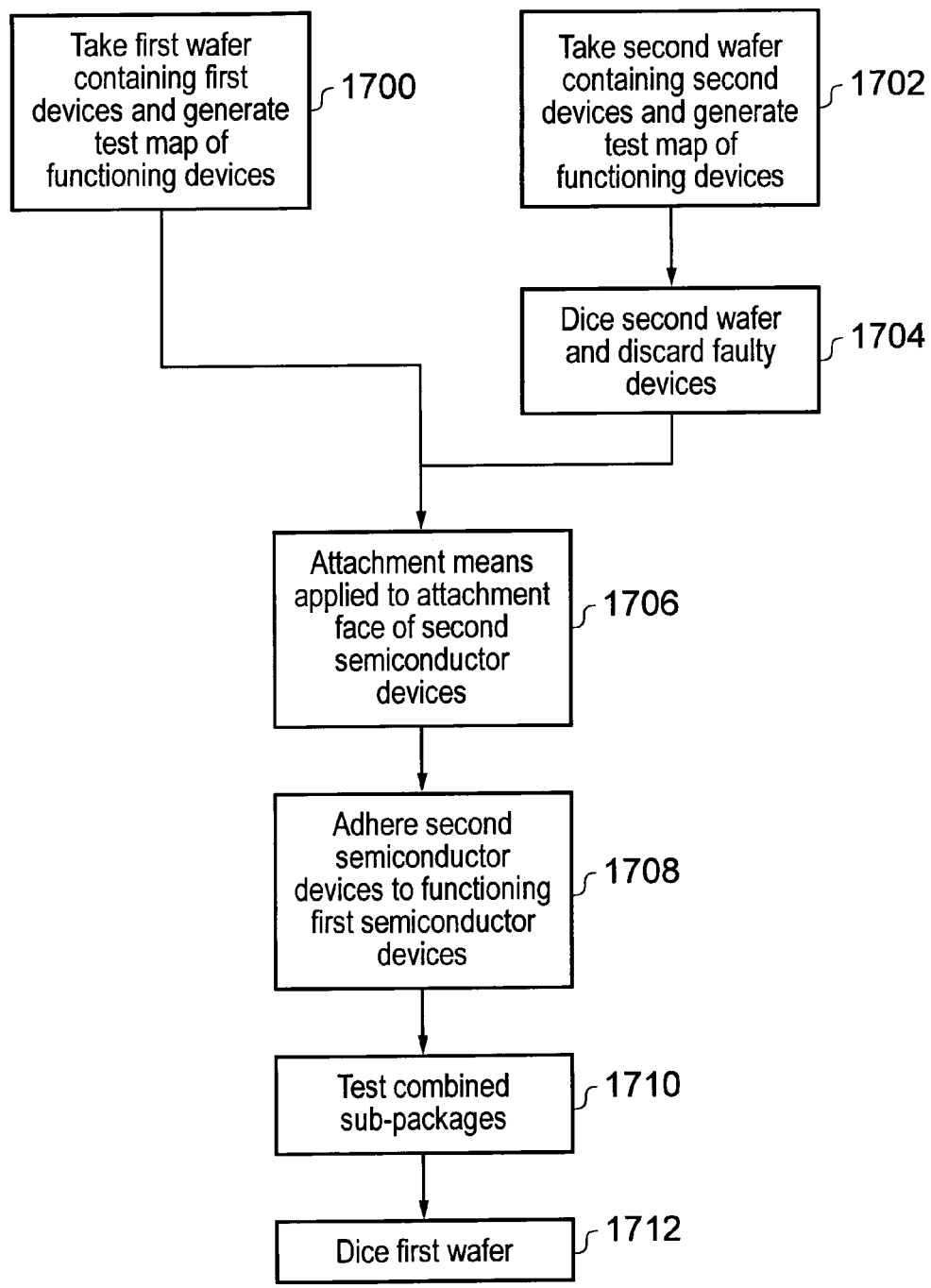

FIG. 8 shows a side elevation, cross-sectional view of a WLCSP-type semiconductor package according to a third embodiment of the invention;

FIG. 9 shows a side elevation, cross-sectional view of a WLCSP-type semiconductor package according to an embodiment of the fourth aspect of the invention;

FIG. 10 shows a side elevation, cross-sectional view of a WLCSP-type semiconductor package according to a fifth embodiment of the invention;

FIG. 11 shows a further embodiment in which Silicon Through Vias are used in the semiconductor package;

FIG. 12 shows a further embodiment in which a wire bonded sub-package is mounted within the semiconductor package;

FIG. 13 shows an example manufacturing flow for an embodiment of the invention using "pick and place" assembly equipment;

FIG. 14 shows an example manufacturing flow for an embodiment of the invention using an interim tool;

FIG. 15 shows a further example manufacturing flow for an embodiment of the invention;

FIG. 16 shows a further example manufacturing flow for an embodiment of the invention; and FIG. 17 shows a flow chart outlining the process steps used to make an embodiment of the invention.

Figure 1:
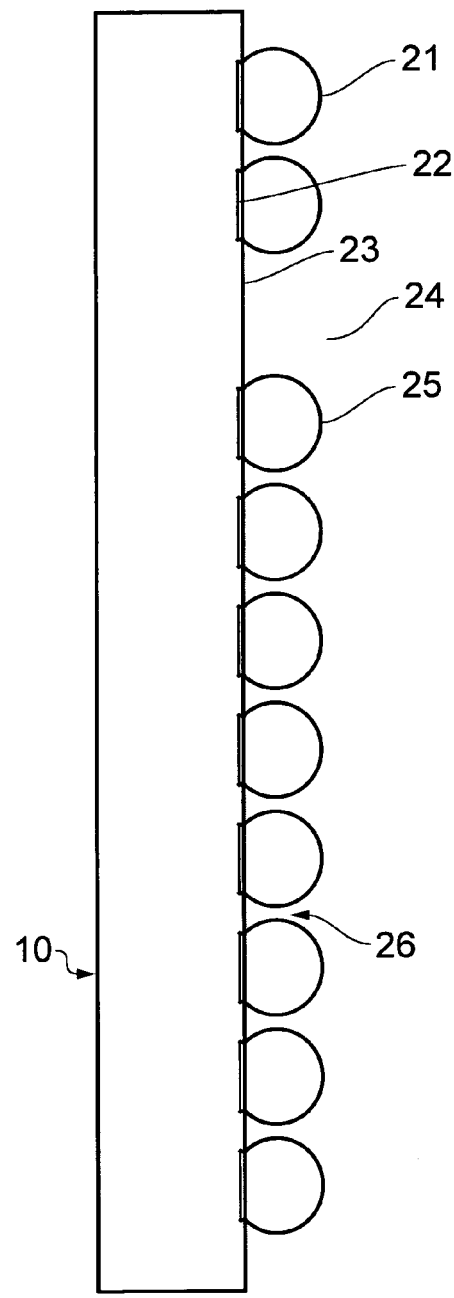
FIG. 1 (PRIOR ART) shows a side elevation, cross-sectional view of a known Wafer-Level Chip-Scale Packages (WLCSP) type semiconductor package.
Figure 2:
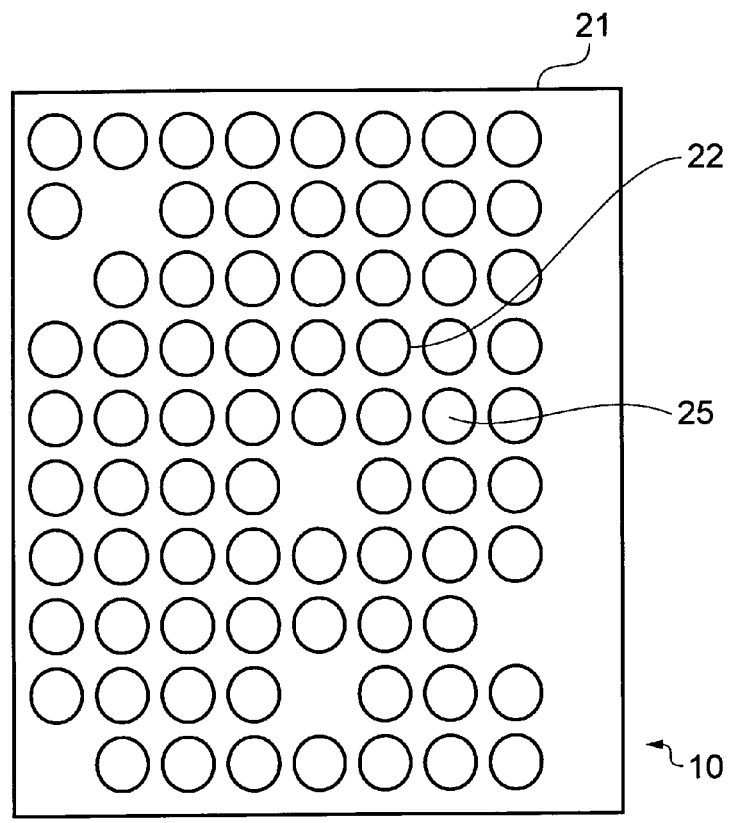
FIG. 2 (PRIOR ART) shows a bottom plan view of a known WLCSP-type semiconductor package having, a plurality of connectors depending from a connector face thereof.
Figure 3:
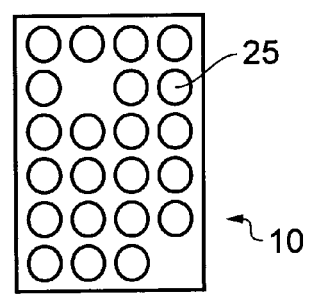
FIG. 3 (PRIOR ART) shows a bottom plan view of a known WLCSP-type semiconductor package having a plurality of connectors of smaller size and lower profile than those shown in FIG. 2.
Figure 4:
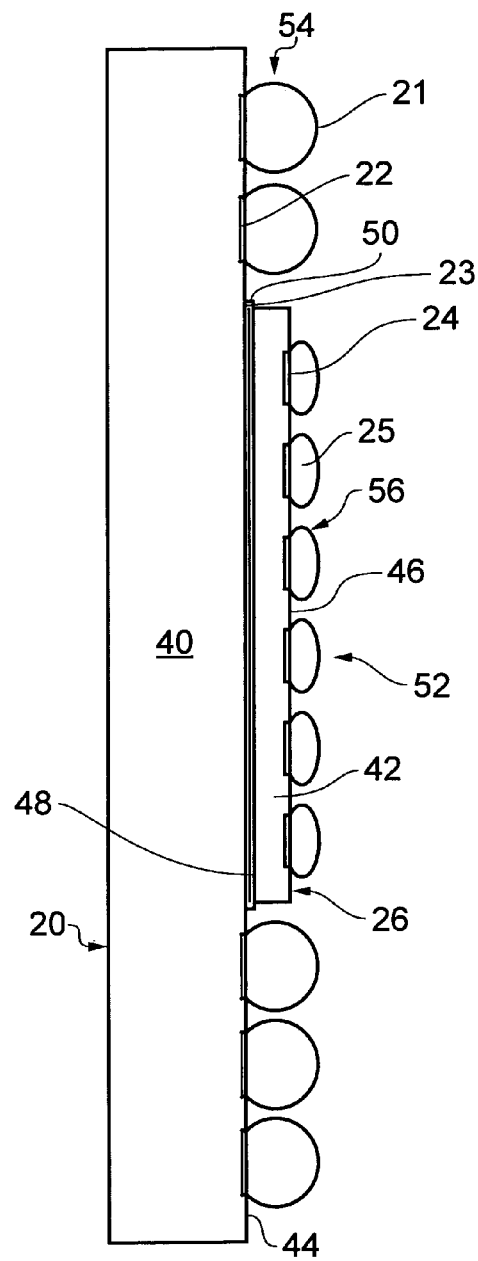
FIG. 4 shows a side elevation, cross-sectional view of a semiconductor package according to an embodiment of the invention.

FIG. 4 shows a semiconductor package 20 according to an embodiment of a first aspect of the invention which comprises a first semiconductor sub-package 40 (which contains a first semi-conductor device) and a second semiconductor sub-package 42 (which contains a second semi-conductor device).

The first semiconductor sub-package 40 has a connection face 44 from which a plurality of connectors 21 depend therefrom. The connectors 21 can be thought of as un-supported in that they do not have material, such as resin or the like, in between.

The second semiconductor sub-package 42 also has a connection face 46 from which connectors 25 depend therefrom. On a side of the second semiconductor sub-package, opposite the connection face 46, there is an attachment face 48.

In the embodiment being described, the first semiconductor sub-package 40 may have a depth of roughly 440 μm. However, the first semiconductor sub-package may have a depth in the range of roughly 150 μm to roughly 700 μm.

The first semiconductor sub-package 40 comprises a first semiconductor device having plurality of pads 22 to which the connectors 21 of the first semiconductor sub-package are attached. In this embodiment, the connectors 21 of the first semiconductor sub-package comprise solder balls which may typically have a height of roughly 260 μm. However, the solder balls may have a height in the range of roughly 150 μm to roughly 350 μm (or indeed any height in between these extremes). Other forms of connectors may be used on the first semiconductor sub-package 40.

Thus, it will be appreciated that the total depth of the package 20 is roughly 700 μm (the height of the connectors 21 and the first semiconductor sub-package 40). This height includes the height of both the first and second semiconductor sub-packages.

The second semiconductor sub-package 42 comprises a second semiconductor device having a plurality of pads 24 to which the connectors 25 of the second semiconductor sub-package are attached. In this embodiment, the connectors 25 of the second semiconductor sub-package 42 comprise so-called solder bumps. These solder bumps would typically have a height of 100 μm. However, the solder bumps may have a height in the range of roughly 50 μm to roughly 150 μm (or any height in between these two extremes). Other forms of connectors may be used on the second semiconductor sub-package 42.

In this embodiment, a central region 52 of the connection face 46 of the first semiconductor sub-package is devoid of connectors 21 to provide an area of the connection face 46 in which there are no connectors 21. In other embodiments, the area with no connectors need not be provided in a central region 52 of the connection face 46.

An attachment means 50, in this case an epoxy adhesive, is used to attach the second semiconductor sub-package 42 to the first semiconductor sub-package 40 such that the attachment face 48 is attached to the connection face 44 of the first semiconductor sub-package 40. The second semiconductor sub-package 42 is provided in the area with no connectors. In this embodiment the attachment means has a depth of typically 25 μm. However, in other embodiments the attachment means may have a different depth which may be in the range 10 μm to roughly 50 μm.

The bottom faces 54 of the connectors 21 of the first semiconductor sub-package 40 are arranged to be roughly in the same plane as the bottom face 56 of the connectors 25 of the second semiconductor sub-package 42.

FIG. 5a shows an underneath plan view of the arrangement of FIG. 4.

Figure 5B:
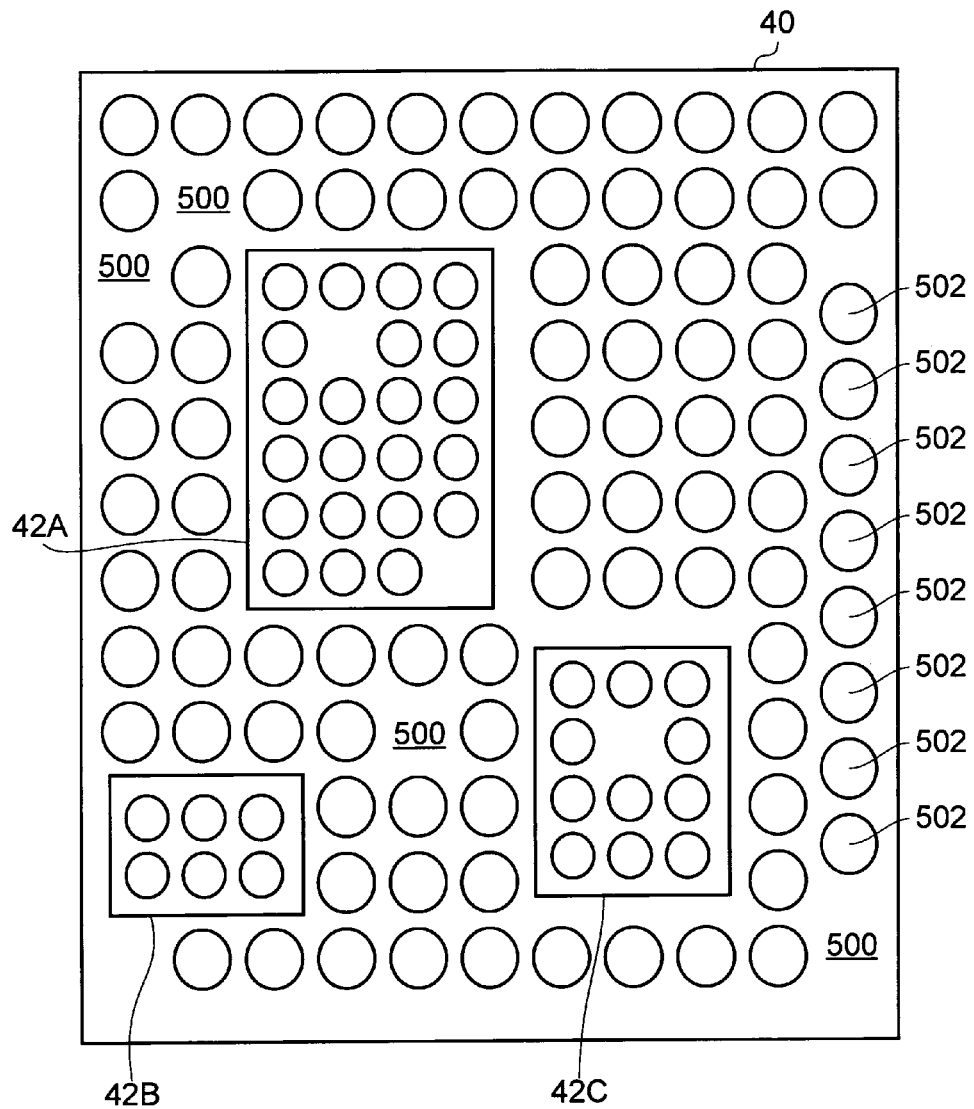

The region devoid of connectors 21 at a central region 52 of the first semiconductor sub-package 40 can be seen in which the second semiconductor sub-package 42 is attached FIG. 5b shows a further embodiment in which three second sub-packages 42a, 42b, 42c have been mounted on the connection face of the first semiconductor sub-package 40.

In this embodiment, regions 500 of the connection face of the first sub-package have no connectors 21. In this embodiment, although not discernible in the Figure, the areas between the second sub-packages 42a-c and the connection face of the first sub-package 40 are also devoid of connectors 21. In other embodiments, connectors may be provided in the areas between the second sub-packages 42a-c and the connection face of the first sub-package 40 which may be used to make electrical connections between the first and any other semiconductor devices within the sub-packages.

It should also be noticed that whilst the majority of the connectors on the first sub-package are shown in a grid, the eight rightmost connectors 502 are displaced from the grid. Thus, whilst a grid of connectors is typical connectors 21 need not be provided in a grid.

FIG. 6 shows how the connectors 21 of the first semiconductor sub-package 40 are attached to the contact pads 22 of the first semiconductor device. Tracks are run from each of the contact pads 22 to a corresponding connector 21. Thus, a signal can be carried from one of the contact pads 22 to the corresponding connectors 21, via the pad 22.

FIG. 7 shows an embodiment which is similar to that shown in FIG. 4 and like parts are referred to with the same reference numerals. In this embodiment the height of the first semiconductor sub-package 40 is less than in the embodiment shown in FIG. 4. In this embodiment the height of the first semiconductor sub-package 40 is roughly 250 μm.

Thinning of the first semiconductor sub-package 40 in this manner reduces the overall height of the package 20 to approximately 500 μm (the height of the connectors 21 is in addition to the height of the first semiconductor sub-package 40).

Thinning of the first semiconductor device 40 is achieved by known wafer thinning techniques such as back-grinding, polishing, etching, abrading or the like.

FIG. 8 shows a further embodiment, again, in which like parts are referred to with like reference numerals. In this embodiment, the bottom face 54 of the connectors 21 of the first semiconductor sub-package 40 do not lie in the same plane as the bottom face 56 of the connectors 25 of the second semiconductor sub-package 42 since the connectors 21 of the first semiconductor sub-package 40 are smaller bump connectors rather than larger ball connectors. As such the package 20 of this embodiment is not suitable for mounting directly to a planar surface.

A further embodiment is shown in FIG. 9 and again like parts are referred to with like reference numerals. In this embodiment the connectors 21 of the first semiconductor sub-package 40 and of the second semiconductor sub-package 25 are encapsulated in a protective material 900 which is for example an epoxy resin. It will be seen that the bottom faces of the connectors 21, 25 protrude from the protective material 900 in order that electrical connection can be made to them. The connectors of this embodiment, may be thought as being supported by the protective material 900.

FIG. 10 shows the embodiment of FIG. 9 to which further connectors 1000, in this case solder bumps, have been mounted on the exposed bottom faces 52, 54 of the connectors 21, 25. Such further connectors 1000 may help to mount the package 20.

FIG. 11 shows an embodiment in which the first semiconductor sub-package 40 has vias 150 passing therethrough. The vias 150 are filled with a conducting material and are arranged to carry signals from a side of the first semiconductor sub-package opposite the connection face to connection face or visa versa.

Connectors 152 are provided on an end region of the vias 150 on the side of the first semiconductor sub-package 40 opposite the connection face. The connectors 152 allow further sub-packages 154, 156 to be electrically connected to the vias 152. It will be seen from the Figure that the further sub-packages 154, 156 are mounted on the side of the first semiconductor sub-package 40 opposite the connection face such that the first semiconductor sub-package 40 is sandwiched between the further sub-packages 154, 156 and the second sub-package 42. Portions 153 of Anisotropic Conductive Adhesive (ACA), or Anisotropic Conductive Film (ACF) are provided on an end region of the vias 152 which electrically connect the vias to the semiconductor device within the further sub-packages 154, 156.

The vias 152 can be arranged to connect to the first semiconductor device within the first semiconductor sub-package and/or pass through the first semiconductor sub-package 40. If the vias pass through the first semiconductor sub-package 40 they may be arranged to electrically connect to the second semiconductor device within the second semiconductor sub-package 42.

The vias 152 can be fabricated by known techniques such as those discussed in http://www.izm.fraunhofer.de/fhg/Images/AR 2007 EN WEB FINAL tc m358-116845.pdf Page 12, 18-22, 51-54.

FIG. 12 shows a further embodiment in which a further sub-package 160 which is attached to a side of the first semiconductor sub-package 40 on a side opposite the connection face thereof using an attachment means 162. This attachment means 162 can be any of the attachment means described elsewhere in this document.

The connectors of the first 40 and second 42 sub-packages are mounted on a substrate 164. The further sub-package 160 is wire bonded using wires 166 to the substrate 164 in order to electrically connect the further sub-package to the substrate 164. Thus connectors (not shown) on a connection face 168 of the substrate allow the first 40, second 42 and further 160 sub-packages to be electrically connected.

A protective material 170 is used to encapsulate the three sub-packages 40, 42, 160 in order to provide mechanical strength, such as to protect the wire bonds 166.

FIGS. 13 and 17 show how a first embodiment the invention may be fabricated.

A first wafer 1100 is shown in FIG. 13a which comprises a plurality of first semiconductor devices. Superimposed on the wafer 1100 is a grid which represents a test-map, with each square of the map representing a first semiconductor device. Represented by box 1700.

Shown in the FIG. 13b there is shown a second wafer 1102 which comprises a plurality of second semiconductor devices. Again, there is superimposed on the surface of the wafer 1102 a test-map, with each square of the map representing a second semiconductor device. The test-maps are generated after the wafers have been finished (but before they are diced) and retain a map of which devices are functional (or are likely to be functional). Represented in box 1702.

In the Figure the test map on the first wafer 1100 shows that there are two devices 1104, 1106 which are likely to be non-functioning and these are marked with an 'X'. Likewise the test-map of the second wafer 1102 shows that there is likely to be single device that does not function.

FIG. 13c shows a cross section through the first wafer 1100 and shows two first semiconductor sub-packages 1110, 1112 which have been formed from semiconductor devices by the addition of connectors as is known from fabrication techniques of WLCSP devices. The sub-packages 1110, 1112 are adjoined to one another. The sub-package 1110 is represented by the black region 1114 of the test-map and it can be seen that it is thought to be a functioning device.

In this embodiment, the second wafer 1102 is divided into a plurality of second semiconductor sub-packages which have been fabricated from the semiconductor devices of the second wafer by the addition of connectors as is known from fabrication techniques of WLCSP devices. One such second semiconductor sub-package 1116 is shown is FIG. 13d. The second semiconductor sub-package 1116 is represented by the black area 1118 on the test map for the second wafer 1102. This second semiconductor sub-package 1116 is also thought to be a functioning device. As such, the second wafer is diced into second semi-conductor sub-packages—step 1704—and devices which are known to be faulty are discarded. In particular, only functioning second semi-conductor devices are selected from the diced wafer and the remaining faulty devices are discarded.

The attachment means 50 is applied to the attachment face of each second semiconductor device before the device is attached to the first semiconductor sub-package—step 1706. For example, the attachment means 50 may be applied whilst the second semiconductor sub-package is still part of the wafer, or, an epoxy pre-form may be placed on the attachment face of the second semiconductor sub-package, or the corresponding connection surface of the first semiconductor sub-package. Thus, the attachment means may alternatively be applied to the wafer at the attachment face between steps 1702 and 1704. There may be other possibilities.

In this embodiment, second semiconductor sub-packages that are thought to be functioning are adhered to first semiconductor sub-packages which are also thought to be working. Should a first semiconductor sub-package thought not to be functioning (i.e. it failed testing) it is left with no second semiconductor sub-package attached thereto—step 1708. An example of this is shown in FIG. 13*e* in which the device 1104 (shown as not functioning in the test-map on the first wafer 1100) is left with no second semiconductor sub-package.

Second semiconductor devices that are thought not to be functioning (i.e. they failed testing) may be discarded.

Once all functioning first semiconductor devices have a second semiconductor device attached thereto a functional test may be applied to the combined first and second semiconductor sub-packages in order to determine whether the provided packages are functional—step 1710. Once any testing has been performed the first wafer is cut into components to produce the packages 20 as shown in FIG. 13*f*—step 1712.

FIG. 14 shows an alternative embodiment of how the package could be manufactured. Again like parts are referred to with like reference numerals.

Again, the second wafer is divided to form individual second semiconductor sub-packages 1116. However, in this embodiment, these devices are positioned in an interim tool 1200 which comprises a plurality of spaces 1202, 1204, 1206 into which a second semiconductor sub-packages 1116 may be positioned. The spacing of the spaces is arranged such that a second semiconductor sub-packages 1116 positioned therein is correctly aligned with a first semiconductor sub-packages as described below.

Figures 14A, 14B:
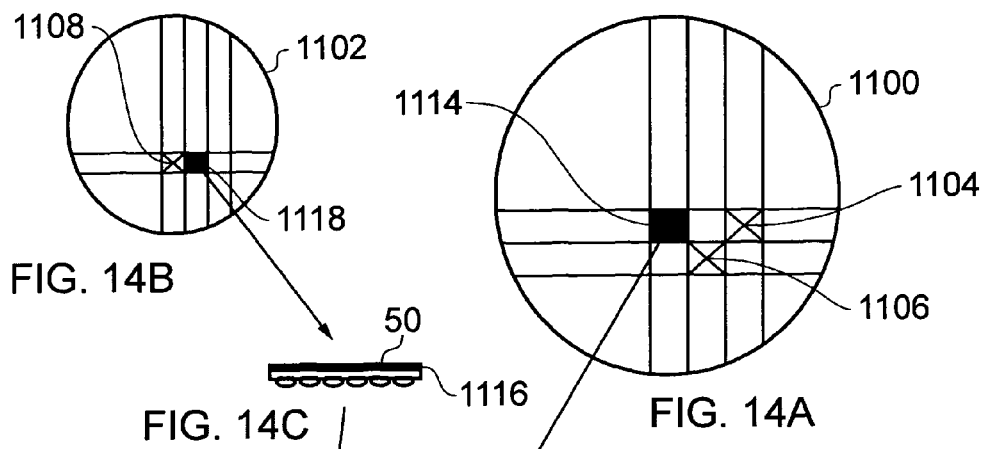
Figures 14C, 14D:
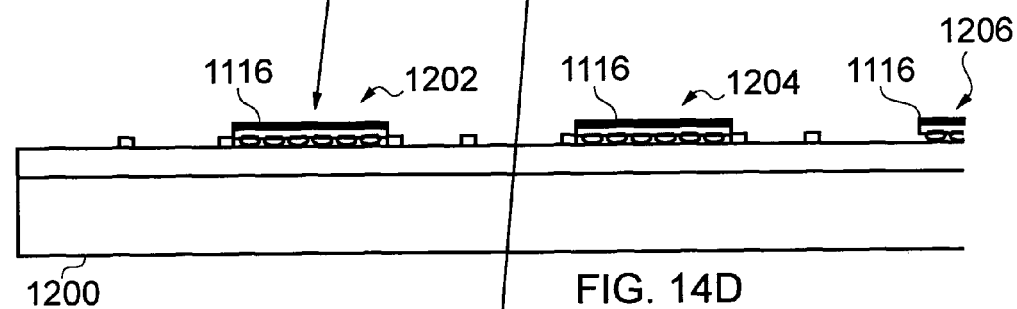
Figure 14E:
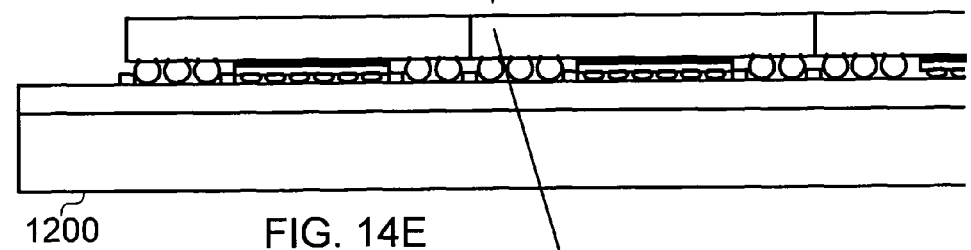

As can be seen in FIG. 14*e* once the interim tool has been populated with second semiconductor devices 1116 a first wafer 1100 is aligned with the interim tool 1200. Alignment markers assist with this. The wafer is brought down onto the interim tool 1200 such that the connection face of functioning first semiconductor sub-packages are brought into contact with a second semiconductor sub-package. The method leaves an unfilled space 1202-1206 in the interim tool which corresponds to a first semiconductor device which is believed to be non-functioning.

Figure 14F:

Once the first semiconductor sub-packages are attached to the second semiconductor sub-packages the first wafer 1100 is removed from the interim tool 1200 and divided to form the packages 20 shown in FIG. 14*f*. Again, testing of the formed semiconductor packages (i.e. the combined first and second semiconductor packages) may be performed before division of the wafer.

In the embodiments of FIG. 13 or 14 an attachment means, which in these embodiments, is a two stage curable adhesive is used to attach the second semiconductor package to the first semiconductor package. Curing of the adhesive is achieve via baking.

FIG. 15 shows a variation of the embodiment shown in FIG. 14. In this embodiment, the interim tool is replaced with a substrate 1300, which in this case is a silicon substrate The substrate 1300 is supported by a jig 1301.

On top of the substrate 1300 there is provided an image 1302 of the grid formed by the first semiconductor sub-packages in the first wafer 1100. This for example, is a full size wafer plot which can be used to indicate where the second semiconductor sub-packages should be placed.

On top of the image 1302 there is provided a clear polymer film 1304 to protect the image and show position reference.

In this embodiment the attachment means is applied to the attachment face of the second semiconductor sub-packages before the second wafer 1102 is divided into devices 1116. As with the embodiment shown in FIG. 14 functioning second sub-packages are placed on the film 1304 adjacent locations of first semiconductor sub-packages which are thought to be functioning. The connection face of the first semiconductor sub-packages on the first wafer is brought against the second semiconductor sub-packages to form the packages 20.

FIG. 16 shows a further variation of the methods of fabricating a package. In this embodiment, a support 1400 is attached to a rear face of the first wafer 100 to support the wafer 100 during processing. Such a support is desirable to prevent the first wafer 100 from being damaged and to prevent warpage. Whilst such a support 1400 may be used in any embodiment, its usefulness increases as the thickness of the first wafer 1100 decreases and the wafer size increases.

It will be appreciated that the first semiconductor sub-package and the second semiconductor sub-package may be fully developed Wafer-Level Chip-Scale Packages in their own right. These sub-packages can be advantageously combined in accordance with the present invention to form a new combined product. This reduces the time to market and the amount of programme and hardware development when compared to the demands of developing a new fully integrated chip design.

The invention claimed is:

1. A semiconductor package comprising:
   a first semiconductor sub-package having a connection face with connectors that are un-supported by protective encapsulation material depending therefrom arranged to electrically connect an active surface of a first semiconductor device contained therein to an external circuit, and
   at least one second semiconductor sub-package also having connectors that are un-supported by protective encapsulation material depending therefrom arranged to electrically connect a second semiconductor device contained therein to an external circuit,
   the second semiconductor sub-package also having an attachment face, on an opposite side thereof from the connection face;
   wherein the second semiconductor sub-package is mounted on the first semiconductor sub-package such that its attachment face is coupled to the connection face of the first semiconductor sub-package, and wherein the first semiconductor sub-package is a Wafer Level Chip-Scale Package comprising the first semiconductor device with packaging layers deposited on its active surface.

2. A package according to claim 1 in which the second semiconductor sub-package is arranged such that a bottom face of the connectors of the first semiconductor sub-package is arranged to be substantially in a plane with a bottom face of the connectors of the second semiconductor sub-package.

3. A package according to claim 1 in which the form of the connectors of the first semiconductor sub-package are selected from spheres or "balls" of pre-formed metal, "balls" of preformed metal alloy, "balls" of conductive adhesive, plated metal "bumps" and printed metal "bumps"; and the form of the connectors of the second semi-conductor sub-package are selected from spheres or "balls" of pre-formed metal, "balls" of preformed metal alloy, "balls" of conductive adhesive, plated metal "bumps", and printed metal "bumps".

4. A package according to claim 1 in which the connectors of the first and second semiconductor sub-packages are of different dimensions.

5. A package according to claim 1 in which the pitch size of the connectors on the second semiconductor sub-package is the same, larger or smaller than the pitch size of the connectors on the first semiconductor sub-package.

6. A package according to claim 1 in which the height of the second semiconductor sub-package and the connectors depending therefrom is arranged to be substantially equal to the height of the connectors depending from the first semiconductor sub-package.

7. A package according to claim 1 in which the second semiconductor sub-package is attached to the first semiconductor sub-package with an attachment means that is impermeable or substantially impermeable to moisture, the attachment means being selected from an adhesive such as epoxy adhesive, solder alloy, anisotropic conductive adhesive or plated nano-fibres.

8. A package according to claim 7 in which the attachment means is arranged to have a compatible coefficient of thermal expansion to any of the following: the first semiconductor sub-package, the second semiconductor sub-package, a circuit board on which the package is to be mounted.

9. A package according to any of claim 7 in which the attachment means is electrically conductive.

10. A package according to claim 1 in which at least one area of the connection face of the first semiconductor sub-package is provided with substantially no connectors.

11. A package according to claim 1 in which the connectors are encapsulated in a protective material.

12. A package according to claim 11 in which the connectors are accessible through a bottom surface of the protective material.

13. A package according to claim 1 in which a further sub-package is provided on a face of the first sub-package opposite the connection face.

14. A package according to claim 1 in which the first sub-package has vias provided therethrough; and wherein vias are arranged to connect the connection face of the first sub-package to the side of the first sub-package opposite the connection face.

15. A package according to claim 14 in which end regions of the vias on the side opposite the connection face are exposed and have contact pads connected thereto.

16. A package according to claim 14 in which the vias connect to the first semiconductor device within the first sub-package.

17. A package according to claim 12 in which the further sub-package is electrically connected to using wire bonds.

18. A semiconductor package comprising:
a first semiconductor sub-package having a connection face with connectors that are un-supported by protective encapsulation material, in the form of balls, depending therefrom arranged to electrically connect an active surface of a first semiconductor device contained therein to an external circuit, and
at least one second semiconductor sub-package also having a connection face with connectors that are un-supported by protective encapsulation material depending therefrom, the connectors of the second sub-package being in the form of bumps and being arranged to electrically connect a second semiconductor device contained therein to an external circuit,
the second semiconductor sub-package also having an attachment face, on an opposite side thereof from the connection face;
the second semiconductor sub-package is mounted on the first semiconductor sub-package such that its attachment face is coupled to the connection face of the first semiconductor sub-package; and
the second semiconductor sub-package, including the connectors thereof, is of substantially the same height as the connectors of the first semiconductor sub-package such that a bottom face of the connectors of the first semiconductor sub-package is arranged to be substantially in a plane with a bottom face of the connectors of the second semiconductor sub-package, and wherein the first semiconductor sub-package is a Wafer Level Chip-Scale Package comprising the first semiconductor device with packaging layers deposited on its active surface.

19. A package according to claim 7 in which the attachment means is electrically non-conductive.

20. A package according to claim 1 in which the packaging layers provide redistribution of electrical signals connecting peripheral pads of the first semiconductor device to a redistributed array of pads.

* * * * *